(12) United States Patent
Hassan et al.

(10) Patent No.: US 9,679,589 B2
(45) Date of Patent: Jun. 13, 2017

(54) MAGNETORESISTIVE SENSOR WITH ENHANCED UNIAXIAL ANISOTROPY

(71) Applicant: Seagate Technology LLC, Cupertino, CA (US)

(72) Inventors: Sameh Hassan, Northern Ireland (GB); Wonjoon Jung, Eden Prairie, MN (US); Mark Kief, Lakeville, MN (US); Marcus Ormston, Northern Ireland (GB)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/851,207

(22) Filed: Sep. 11, 2015

(65) Prior Publication Data
US 2017/0076743 A1   Mar. 16, 2017

(51) Int. Cl.
G11B 5/39    (2006.01)
G11B 5/31    (2006.01)

(52) U.S. Cl.
CPC ............ G11B 5/313 (2013.01); G11B 5/3163 (2013.01)

(58) Field of Classification Search
None
See application file for complete search history.

(56) References Cited

U.S. PATENT DOCUMENTS

| | | | | |
|---|---|---|---|---|
| 6,127,053 A * | 10/2000 | Lin | ......................... | B82Y 10/00 324/252 |
| 6,219,211 B1 * | 4/2001 | Gill | ......................... | B82Y 10/00 360/324.1 |
| 7,360,299 B2 * | 4/2008 | Carey | ..................... | B82Y 10/00 216/62 |
| 7,363,699 B2 * | 4/2008 | Carey | ..................... | B82Y 10/00 216/62 |
| 7,382,573 B2 * | 6/2008 | Carey | ................... | G11B 5/3166 257/E43.006 |
| 7,436,634 B2 * | 10/2008 | Carey | ................... | G11B 5/3166 257/E43.006 |
| 7,457,085 B2 * | 11/2008 | Carey | ..................... | B82Y 25/00 257/E43.004 |
| 7,460,343 B2 * | 12/2008 | Carey | ..................... | B82Y 25/00 257/E43.004 |
| 7,466,515 B2 * | 12/2008 | Carey | ................... | G11B 5/3166 257/E43.006 |
| 7,525,775 B2 * | 4/2009 | Carey | ..................... | B82Y 10/00 360/324.11 |
| 7,529,066 B2 * | 5/2009 | Carey | ................... | G11B 5/3932 360/324.11 |
| 7,564,659 B2 * | 7/2009 | Freitag | ................. | G01R 33/093 360/324.11 |

(Continued)

FOREIGN PATENT DOCUMENTS

JP             02052415 A   *  2/1990
JP    WO 2009154009 A1  * 12/2009  ............. B82Y 10/00

*Primary Examiner* — Will J Klimowicz
(74) *Attorney, Agent, or Firm* — Westman, Champlin & Koehler, P.A.

(57) ABSTRACT

A read sensor that includes a free layer having a magnetization that changes according to an external magnetic field. The read sensor also includes an additional magnetic layer and a non-magnetic layer. The non-magnetic layer may include a corrugated surface facing the additional magnetic layer. The corrugated surface is configured to enhance uniaxial anisotropy in the read sensor.

11 Claims, 12 Drawing Sheets

(56) References Cited

U.S. PATENT DOCUMENTS

| | | | |
|---|---|---|---|
| 7,599,155 B2* | 10/2009 | Saito | G11B 5/3903 360/322 |
| 7,602,033 B2* | 10/2009 | Zhao | B82Y 10/00 257/427 |
| 7,663,847 B2* | 2/2010 | Freitag | B82Y 25/00 360/324.12 |
| 7,672,090 B2* | 3/2010 | Carey | B82Y 25/00 360/324.12 |
| 7,733,614 B2* | 6/2010 | Meguro | B82Y 25/00 360/324.12 |
| 7,791,844 B2* | 9/2010 | Carey | G11B 5/3166 360/324.12 |
| 7,848,065 B2* | 12/2010 | Freitag | B82Y 25/00 360/324.12 |
| 7,884,405 B2* | 2/2011 | Drewes | G11C 11/16 257/295 |
| 7,900,342 B2* | 3/2011 | Freitag | B82Y 10/00 216/62 |
| 8,031,441 B2* | 10/2011 | Zhang | B82Y 10/00 360/324.1 |
| 8,582,249 B2* | 11/2013 | Sapozhnikov | G01R 33/093 360/324.11 |
| 8,675,318 B1* | 3/2014 | Ho | G11B 5/398 360/324.11 |
| 8,922,951 B2* | 12/2014 | Sapozhnikov | G11B 5/3912 360/319 |
| 9,269,382 B1* | 2/2016 | Bertero | G11B 5/3929 |
| 9,305,578 B1* | 4/2016 | Singleton | G11B 5/3932 |
| 2005/0105223 A1 | 5/2005 | Larson et al. | |
| 2007/0035894 A1* | 2/2007 | Freitag | G01R 33/093 360/326 |
| 2007/0109692 A1* | 5/2007 | Carey | B82Y 10/00 360/324.1 |
| 2008/0137237 A1* | 6/2008 | Freitag | B82Y 25/00 360/324.12 |
| 2008/0278864 A1* | 11/2008 | Zhang | B82Y 10/00 360/324.12 |
| 2014/0001585 A1 | 1/2014 | Dimitrov et al. | |
| 2014/0106183 A1 | 4/2014 | Sapozhnikov et al. | |
| 2014/0133052 A1* | 5/2014 | Meguro | G11B 5/3906 360/234.3 |
| 2014/0133221 A1 | 5/2014 | Cowburn | |
| 2014/0340792 A1 | 11/2014 | Covington et al. | |
| 2015/0055251 A1* | 2/2015 | Sapozhnikov | G11B 5/3932 360/235.4 |
| 2015/0154986 A1 | 6/2015 | Freitag et al. | |
| 2016/0196840 A1* | 7/2016 | Singleton | G11B 5/3932 216/22 |

* cited by examiner

MAGNETORESISTIVE SENSOR WITH ENHANCED UNIAXIAL ANISOTROPY

BACKGROUND

Data storage devices commonly have a recording head that includes a read transducer that reads information from a data storage medium and a write transducer that writes information to a data storage medium.

In magnetic data storage devices such as disc drives, a magnetoresistive (MR) sensor such as a Giant Magnetoresistive (GMR) sensor or a Tunnel Junction Magnetoresistive (TMR) sensor may be employed as the read transducer to read a magnetic signal from the magnetic media. The MR sensor has an electrical resistance that changes in response to an external magnetic field. This change in electrical resistance can be detected by processing circuitry in order to read magnetic data from the adjacent magnetic media.

With ever-increasing levels of recording density in disc drives and a need for faster data transfer speeds, the read transducer needs to have correspondingly better data-reproducing capabilities.

SUMMARY

The present disclosure relates to a read sensor design which improves magnetic stability of the sensor by enhancing uniaxial anisotropy of at least one magnetic layer in the sensor. The read sensor includes a free layer having a magnetization that changes according to an external magnetic field. The read sensor also includes an additional magnetic layer and a non-magnetic layer. The non-magnetic layer may include a corrugated surface facing the additional magnetic layer. The corrugated surface is configured to enhance uniaxial anisotropy in the read sensor.

Other features and benefits that characterize embodiments of the disclosure will be apparent upon reading the following detailed description and review of the associated drawings.

DETAILED DESCRIPTION OF ILLUSTRATIVE EMBODIMENTS

Magnetic reproducing device embodiments described below relate to a read sensor design which improves magnetic stability of the sensor by enhancing uniaxial anisotropy of at least one magnetic layer of the sensor. However, prior to providing additional details regarding the different embodiments, a description of an illustrative operating environment is provided below.

Figure 1:
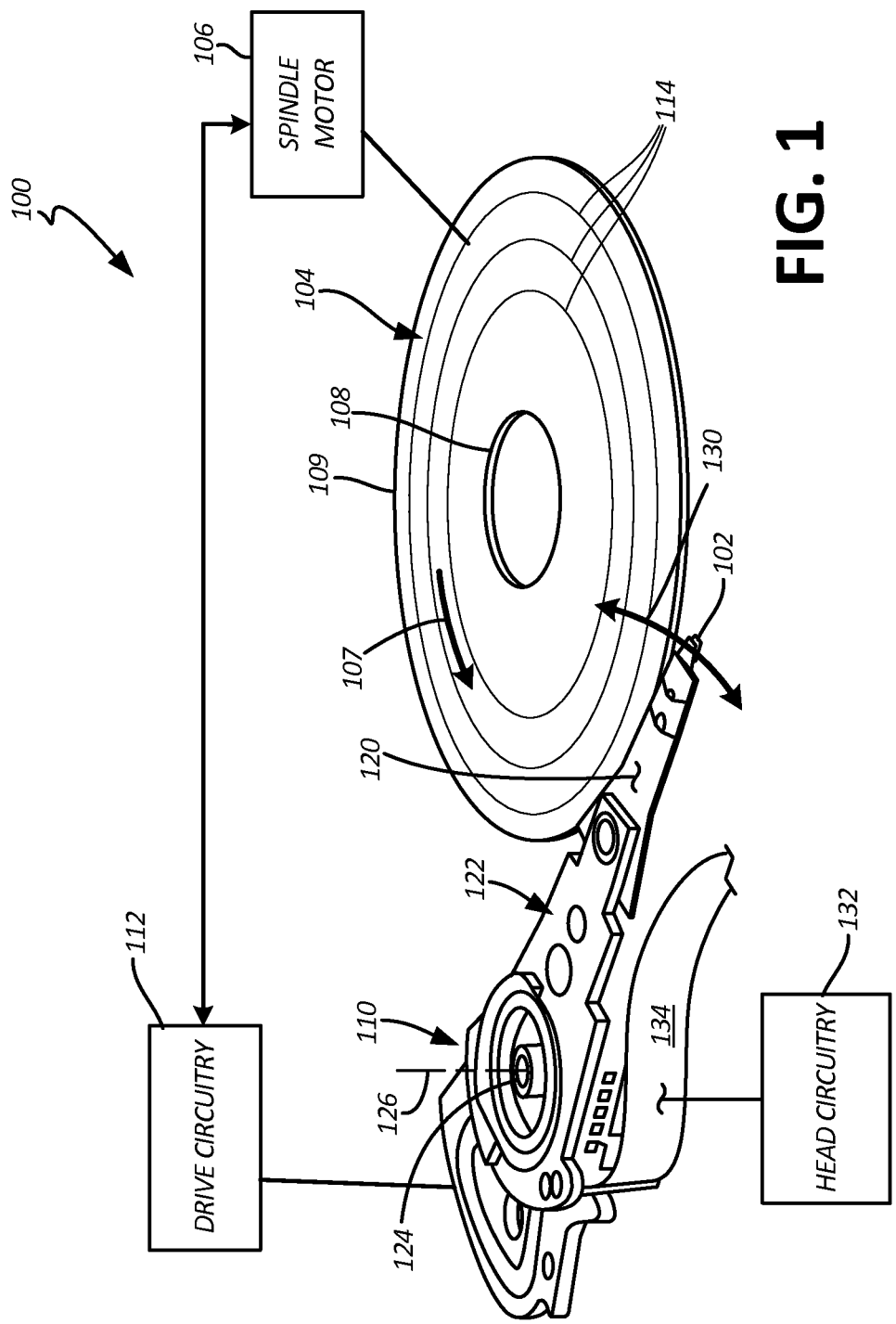
FIG. 1 is a schematic illustration of an example data storage system including a data storage medium and a head for reading data from and/or writing data to the data storage medium.

FIG. 1 shows an illustrative operating environment in which certain specific embodiments disclosed herein may be incorporated. The operating environment shown in FIG. 1 is for illustration purposes only. Embodiments of the present disclosure are not limited to any particular operating environment such as the operating environment shown in FIG. 1. Embodiments of the present disclosure are illustratively practiced within any number of different types of operating environments. It should be noted that the same reference numerals are used in different figures for same or similar elements.

FIG. 1 is a schematic illustration of a data storage device 100 including a data storage medium and a head for reading data from and/or writing data to the data storage medium. In data storage device 100, head 102 is positioned above storage medium 104 to read data from and/or write data to the data storage medium 104. In the embodiment shown, the data storage medium 104 is a rotatable disc or other magnetic storage medium that includes a magnetic storage layer or layers. For read and write operations, a spindle motor 106 (illustrated schematically) rotates the medium 104 as illustrated by arrow 107 and an actuator mechanism 110 positions the head 102 relative to data tracks 114 on the rotating medium 104 between an inner diameter 108 and an outer diameter 109. Both the spindle motor 106 and actuator mechanism 110 are connected to and operated through drive circuitry 112 (schematically shown). The head 102 is coupled to the actuator mechanism 110 through a suspension assembly which includes a load beam 120 connected to an actuator arm 122 of the mechanism 110 for example through a swage connection. Although FIG. 1 illustrates a single load beam coupled to the actuator mechanism 110, additional load beams 120 and heads 102 can be coupled to the actuator mechanism 110 to read data from or write data to multiple discs of a disc stack. The actuator mechanism 110 is rotationally coupled to a frame or deck (not shown) through a bearing 124 to rotate about axis 126. Rotation of the actuator mechanism 110 moves the head 102 in a cross track direction as illustrated by arrow 130.

The head 102 includes one or more transducer elements (not shown in FIG. 1) coupled to head circuitry 132 through flex circuit 134. Details regarding elements of a head such as 102 are provided below in connection with FIG. 2.

Figure 2:
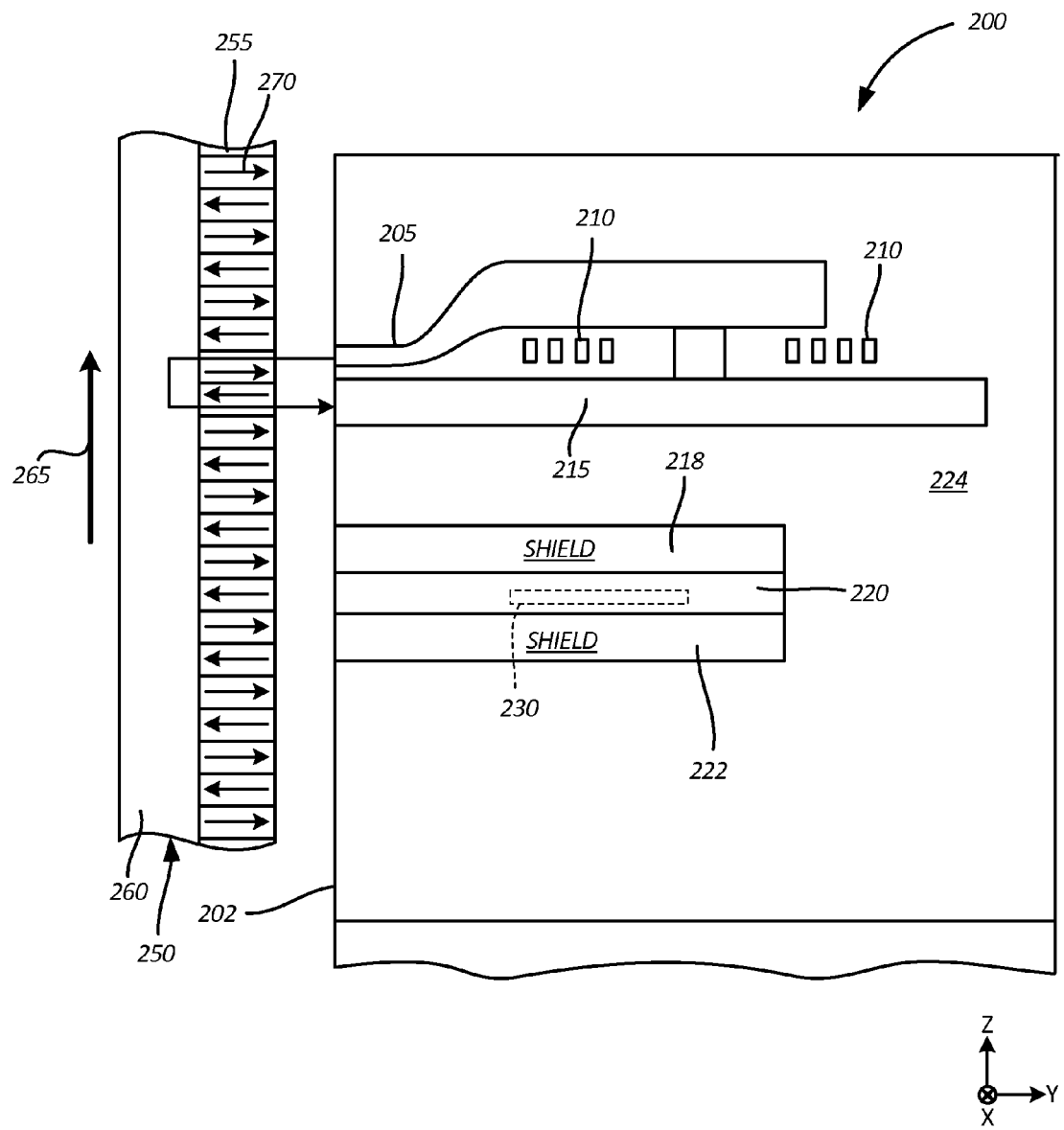
FIG. 2 is a schematic diagram of a cross-section of one embodiment of a recording head that reads from and writes to a storage medium.

FIG. 2 is a schematic diagram showing a cross-sectional view of portions of a recording head 200 and a data storage medium 250 taken along a plane substantially normal to a plane of a bearing surface (for example, an air bearing surface (ABS)) 202 of recording head 200. The recording head elements shown in FIG. 2 are illustratively included in a recording head, such as recording head 102 in FIG. 1. Medium 250 is illustratively a data storage medium, such as medium 104 in FIG. 1. Those skilled in the art will recognize that recording heads and recording media commonly include other components. Embodiments of the present disclosure are not limited to any particular recording heads or media. Embodiments of the present disclosure may be practiced in different types of recording heads and media.

Recording head 200 includes a write pole 205, a magnetization coil 210, a return pole 215, a top shield 218, a read transducer 220, a bottom shield 222 and a wafer overcoat 224. Storage medium 250 includes a recording layer 255 and an underlayer 260. Storage medium 250 rotates in the direction shown by arrow 265. Arrow 265 is illustratively a direction of rotation such as arrow 107 in FIG. 1.

In an embodiment, electric current is passed through coil 210 to generate a magnetic field. The magnetic field passes from write pole 205, through recording layer 255, into underlayer 260, and across to return pole 215. The magnetic field illustratively records a magnetization pattern 270 in recording layer 255. Read transducer 220 senses or detects magnetization patterns in recording layer 255, and is used in retrieving information previously recorded to layer 255.

To address magnetic stability-related challenges, a uniaxial anisotropy enhancing feature 230 is included in the read transducer 220. The uniaxial anisotropy enhancing feature 230 may include and/or provide structurally enhanced uniaxial anisotropy along a direction of a shape anisotropy, such as the shape anisotropy of one or more magnetic layers of the read transducer 220. As will be described in detail further below, the uniaxial anisotropy enhancing feature 230 may include altered textures and/or a corrugated or rough surface of a non-magnetic layer facing a magnetic layer in the read transducer 220. In such examples, the uniaxial anisotropy enhancing feature 230 may be generated by an oblique incidence deposition.

In the reader embodiments, layers of read transducer 220 may be stacked along a track direction (i.e., a z-direction in FIG. 2) or a track width direction that is normal to the track direction (i.e., a cross-track direction, which is an x-direction in FIG. 2). A y-direction in FIG. 2 is then defined as a direction that is perpendicular to x and z simultaneously, which is a stripe-height direction. In the embodiment shown in FIG. 2, layers of read transducer 220 may be stacked along the track direction. Different reader embodiments and structural details regarding uniaxial anisotropy enhancement features within the different embodiments are described below in connection with FIGS. 3A-5B. Also, details regarding generation of the uniaxial anisotropy enhancement feature are provided further below in connection with FIGS. 6A, 6B, 6C and 7.

Figure 3A:
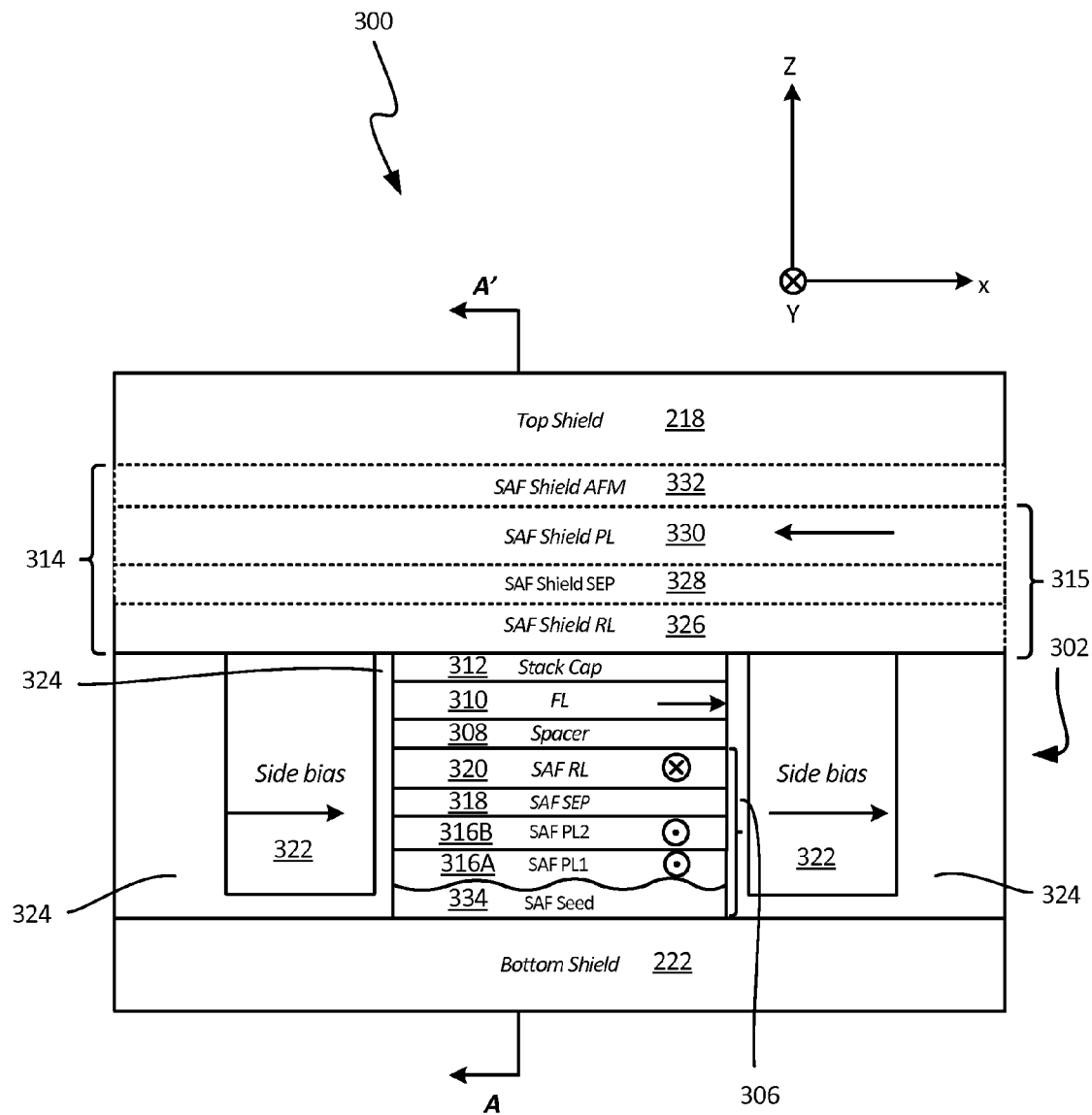
FIG. 3A is a bearing surface view of a first embodiment of a magnetic reproducing device.
Figure 3B:
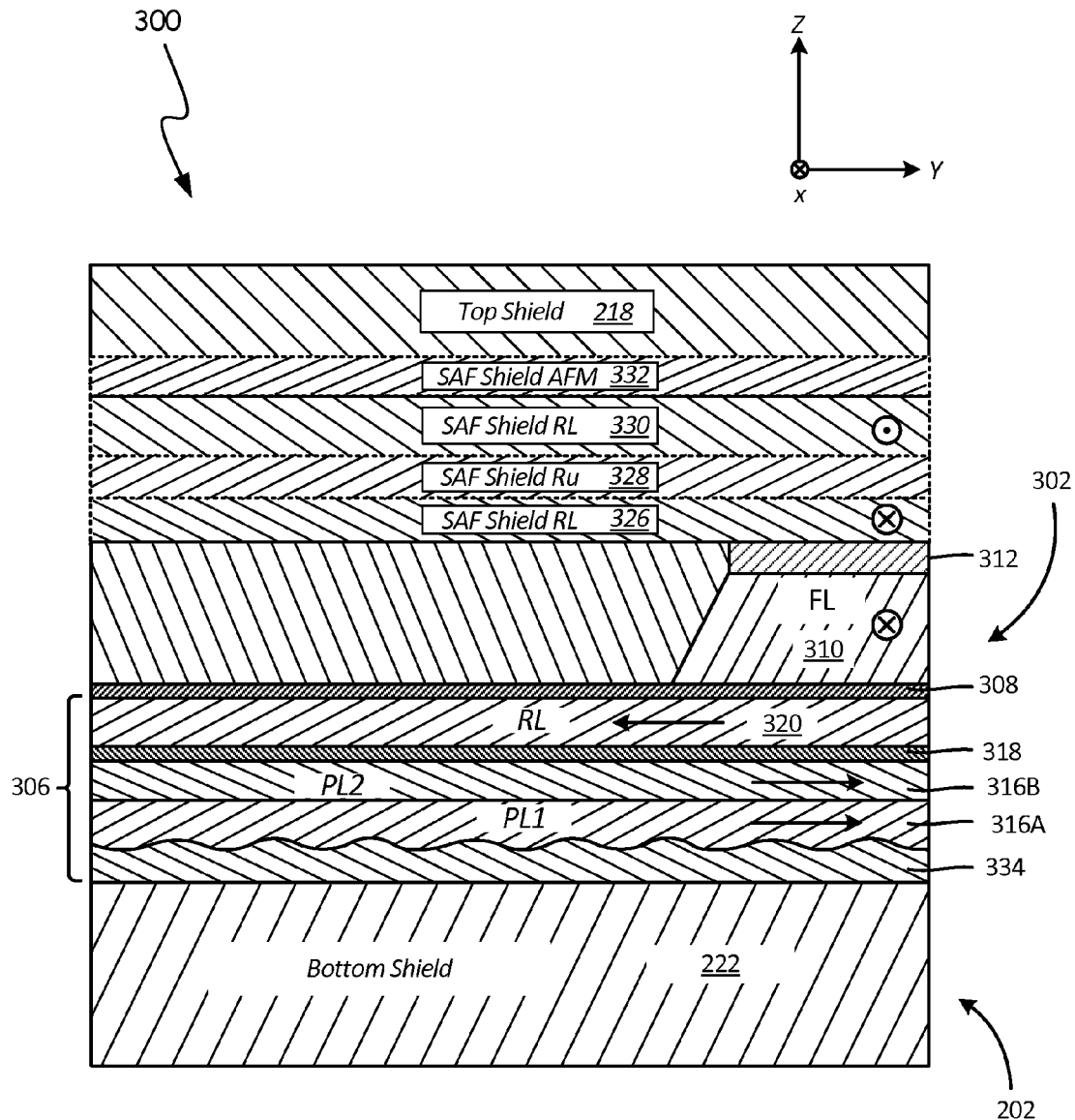
FIG. 3B is a sectional view of the magnetic reproducing device of FIG. 3A.

FIG. 3A is a bearing surface view of a magnetic reproducing device/reader 300 including a magnetoresistive sensor 302 having at least one uniaxial anisotropy enhancement feature. FIG. 3B is a cross-sectional view of reader 300 of FIG. 3A through a plane orthogonal to the bearing surface and layers of reader 300 (along line A-A' shown in FIG. 3A).

Referring to FIGS. 3A and 3B, magnetoresistive sensor 302 is positioned between top shield 218 and bottom shield 222. Top and bottom shields 218 and 222, which may be made of a material having high magnetic permeability, reduce or substantially block extraneous magnetic fields, such as, for example, those from adjacent bits on data discs from impacting the magnetoresistive sensor 302, thus improving the performance of the magnetoresistive sensor 302. In one implementation, the top and bottom shields 218 and 222 permit magnetic fields from the bit directly under magnetoresistive sensor 302 to affect the magnetoresistive sensor 302, and thus be read.

The magnetoresistive sensor 302 includes a plurality of layers including a sensor stack synthetic antiferromagnetic (SAF) structure 306, a spacer layer 308, a free layer or sensing layer 310 and a stack cap 312. A SAF shielding structure 314 may optionally be included above the cap layer 312. Dashed lines are used to represent elements within structure 314 to indicate that structure 314 is optional.

In general, an SAF structure such as 306 includes two or more ferromagnetic layers separated by a non-magnetic layer, which provides antiparallel coupling between the ferromagnetic layers. Stabilization of magnetic moments of the ferromagnetic layers in the range of interest (for example, magnetic fields generated by the bits of data stored on the data discs) may be carried out by "pinning" one of the ferromagnetic layers on an outside surface with an antiferromagnetic (AFM) layer and/or by forming the SAF structure by using suitable shape anisotropy (for example, suitable width/height/depth dimensions) such that the SAF structure is substantially self-pinned.

In addition to pinning the magnetic orientation of the ferromagnetic layer, by enhancing an anisotropy field ($H_K$) of an SAF layer along the direction of the shape anisotropy, performance of the read head may be improved. The direction of the uniaxial anisotropy can also be tuned with respect to the bearing surface to enhance magnetic stability and provide higher sensor readback signal amplitude. Such enhancements may be provided through structure within the sensor, such as by structural aspects within or around the SAF structure such as 306.

$H_K$ within the sensor such as 302 may be enhanced by corrugation or roughness provided on one or more surfaces of one or more layers or films in the sensor and/or by altering a microstructure or texture of one or more films within the sensor. $H_K$ values of approximately 100 to 1000 Oersted (Oe) in cobalt iron boron (CoFeB) and in nickel iron (NiFe) may be obtainable using such enhancements.

In an example, such structural aspects may be achieved with an oblique incidence deposition technique, which may improve magnetic anisotropy originating from long-ranged dipolar interactions between spins or a stray field associated with an unevenness or roughness caused by the oblique incidence deposition technique.

In magnetoresistive sensor 302, the sensor SAF structure 306 is self-pinned and includes a first pinned layer 316a, a second pinned layer 316b, a thin separation layer 318 (which may comprise a metal such as ruthenium (Ru) in some embodiments), and a reference layer 320. The magnetic moments of the reference layer 320 and the pinned layers 316a and 316b are generally oriented normal to the plane (i.e., the y direction) of FIG. 3A, and at least one of the pinned layers 316a or 316b has its magnetic moment generally oriented anti-parallel to the magnetic moment of the reference layer 320. In some embodiments, a thin separation layer similar to 318 may be included between layers 316a and 316b.

In accordance with one embodiment, SAF structure 306 includes at least one layer with structurally enhanced uniaxial anisotropy along a direction of a shape anisotropy of the SAF structure 306. The enhanced uniaxial anisotropy may be provided by altered textures and/or by a corrugated or rough surface that may face a magnetic layer of the SAF structure. In sensor 302, a SAF reader stack seed 334 with a corrugated or rough surface that faces first pinned layer 316a is provided to enhance uniaxial anisotropy. The altered textures or the corrugated or rough surface of the SAF reader stack seed 334 may be generated by oblique incidence depositions. Also, for reasons provided further below, a top surface of the pinned layer 316a may be smoothed by a suitable smoothing technique, such as by a plasma treatment (e.g., plasma etching, plasma cleaning, plasma stripping, or plasma ashing), to prevent unevenness or roughness from propagating through upper layers of the SAF 306.

In one implementation, the free layer 310 is not exchange coupled to, for example, an antiferromagnet. As a result, the magnetic moment of the free layer 310 is free to rotate under the influence of an applied magnetic field in a range of interest. The read head 300 further includes side biasing magnets or side shields 322, which produce a magnetic field that biases the free layer 310 with a magnetic moment parallel to the plane of the figure and generally oriented horizontally. This bias prevents the magnetic moment of the free layer 310 from drifting due to, for example, thermal energy, which may introduce noise into the data sensed by the read head 300. The bias is sufficiently small, however, that the magnetic moment of the free layer 310 can change in response to an applied magnetic field, such as a magnetic field of a data bit stored on the data discs. In some embodiments, the side biasing magnets or side shields 332 are formed of soft magnetic material (i.e., material that can be easily magnetized and demagnetized at relatively low magnetic fields). The soft magnetic material may be an alloy comprising Ni and Fe. The magnetoresistive sensor 302 is separated and electrically isolated from the side biasing magnets 322 by an isolation layer 324 including, for example, insulating materials. Isolation layer 324 may also be present in other regions of head 300 as shown in FIG. 3A.

In the embodiment shown in FIG. 3A, optional SAF shielding structure 314 includes a SAF shield reference layer 326, a thin SAF shield separation layer 328, which may comprise a metal such as Ru in some embodiments, a SAF shield pinned layer 330 and a SAF shield AFM layer 332. Because, in some embodiments, sensor 300 utilizes soft side shields 322, SAF shield reference layer 326 needs to have a relatively fixed magnetization to assist in stabilizing the magnetizations of side shields 322. Thus, AFM layer 332 needs to pin the magnetization of layer SAF shield pinned layer 330 substantially parallel to the bearing surface, which results in the relatively fixed magnetization of SAF shield reference layer 326 due to antiferromagnetic coupling across SAF shield separation layer 328 and thus in stabilizing the magnetizations of the side shields 332 substantially parallel to the bearing surface as well. In some embodiments, AFM layer 332 may be recessed behind the bearing surface. SAF shield reference layer 326 and SAF shield pinned layer 330 may be formed of a soft magnetic material (for example, an alloy comprising Ni and Fe). It should be noted that, instead of employing SAF shielding structure 314, side shields 332 may be stabilized by shape anisotropy, by employing hard magnetic layers adjacent to the soft magnetic layers within side shield 332, or by any other suitable technique.

In some embodiments, sensor 302 may utilize tunnel magnetoresistance (TMR) or giant magnetoresistance (GMR) effects. In embodiments that utilize TMR effects, spacer layer 308 is a tunneling barrier layer that separates the SAF structure 306 from the free layer 310. The tunneling barrier layer 308 is sufficiently thin that quantum mechanical electron tunneling occurs between a reference layer 320 in the SAF structure 306 and the free layer 310. The electron tunneling is electron-spin dependent, making the magnetic response of the magnetoresistive sensor 302 a function of the relative orientations and spin polarizations of the SAF structure 306 and the free layer 310. The highest probability of electron tunneling occurs when the magnetic moments of the SAF structure 306 and the free layer 310 are parallel, and the lowest probability of electron tunneling occurs when the magnetic moments of the SAF structure 306 and the free layer 310 are antiparallel. Accordingly, the electrical resistance of the magnetoresistive sensor 302 changes in response to an applied magnetic field. The data bits on the data discs in the disc drive may be magnetized in a direction normal to the plane of FIG. 3A, either into the plane of the figure, or out of the plane of the figure. Thus, when the magnetoresistive sensor 302 passes over a data bit, the magnetic moment of the free layer 310 is rotated either into the plane of FIG. 3A or out of the plane of FIG. 3A, changing the electrical resistance of the magnetoresistive sensor 302. The value of the bit being sensed by the magnetoresistive sensor 302 (for example, either 1 or 0) may therefore be determined based on the current flowing from a first electrode (not shown) to a second electrode (not shown) connected to the magnetoresistive sensor 302.

As noted above, SAF reader stack seed 334 with the corrugated or rough surface that faces first pinned layer 316a is provided to enhance uniaxial anisotropy. Further, as indicated above, the roughness or corrugation in the SAF reader stack seed 334 may have a degrading effect on SAF coupling and TMR if the unevenness or roughness propagates through upper layers of the SAF 306. For example, where unevenness or roughness is caused by oblique incidence deposition, these negative effects can occur. Thus, as noted above, a smoothing technique (such as a plasma treatment process) is used to smooth an uneven or rough surface of first pinned layer 316a. This can reduce or eliminate the degrading effects on SAF coupling and TMR (such as the degrading effect of uniaxial anisotropy) associated with first pinned layer 316a and thereby isolate the induction of the magnetic anisotropy caused by the unevenness or roughness.

Figure 4A:
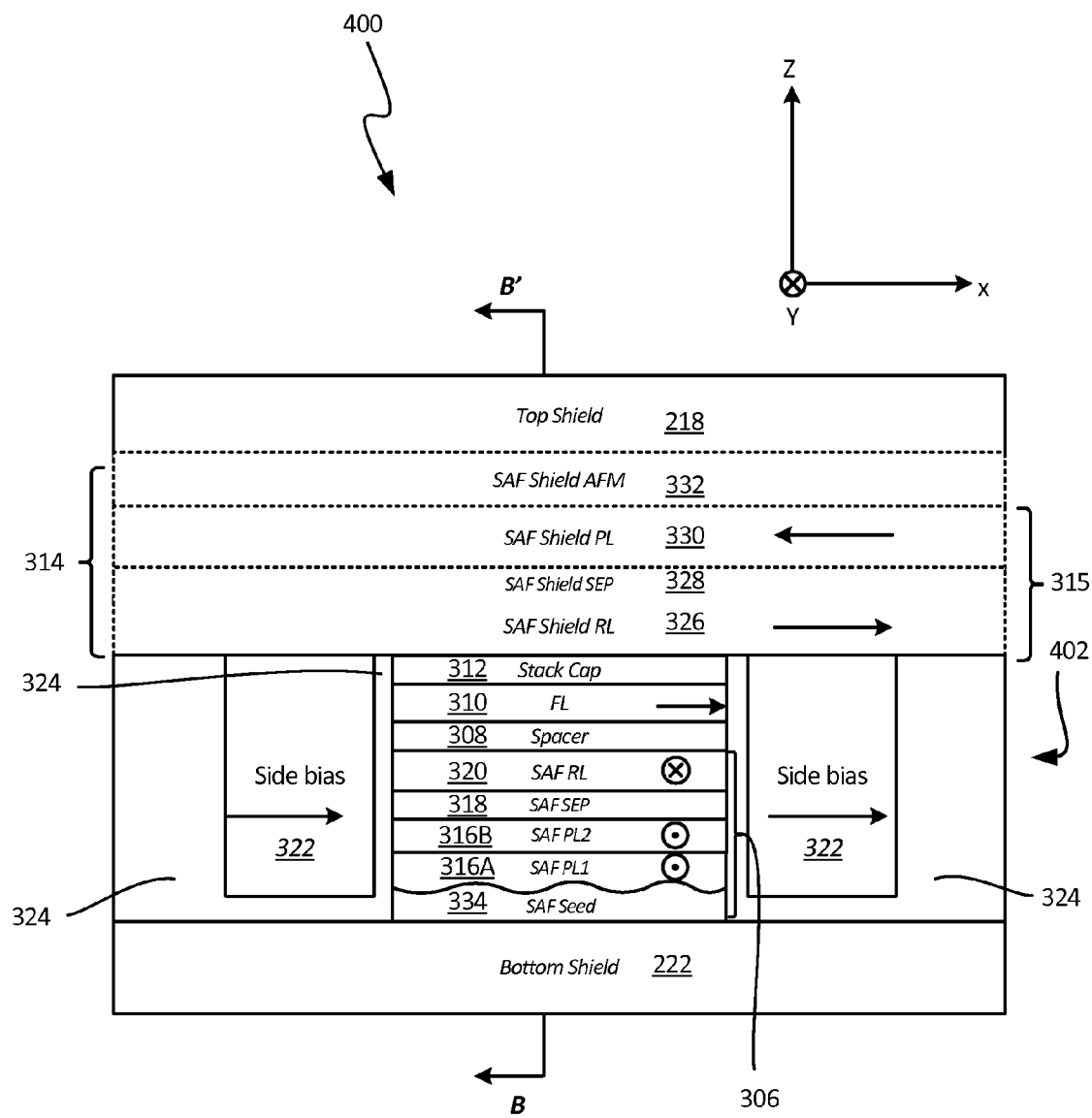
FIG. 4A is a bearing surface view of a second embodiment of a magnetic reproducing device.
Figure 4B:
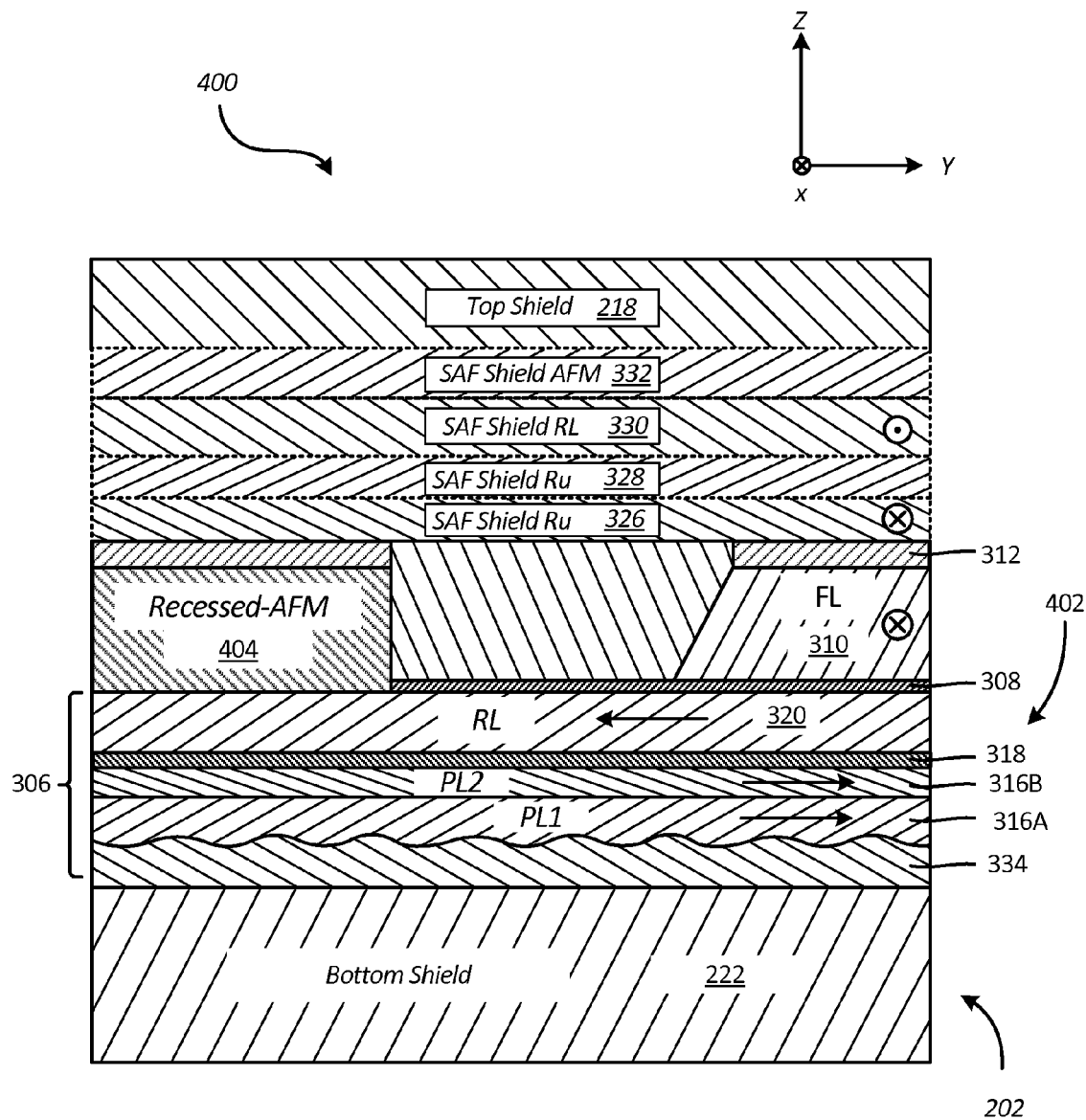
FIG. 4B is a sectional view of the magnetic reproducing device of FIG. 4A.

FIG. 4A is a bearing surface view of a reader 400 which includes a magnetoresistive sensor 402 that employs an AFM layer positioned behind the bearing surface (i.e., recessed) to pin a ferromagnetic layer of an SAF structure such as 306. The recessed AFM layer 404 is shown in FIG. 4B, which is a cross-sectional view of reader 400 of FIG. 4A through a plane orthogonal to the bearing surface and layers of reader 400 (along line B-B' shown in FIG. 4A). Other than additionally employing recessed AFM layer 404 to pin structure 306, reader 400 is similar to reader 300. Thus, a description of the similar elements is not repeated. As noted earlier, an AFM layer such as recessed AFM layer 404 pins a magnetization of a ferromagnetic layer that it contacts. In sensor 402, the magnetization of layer 320 is pinned by AFM layer 404. As in the case of sensor 302 (of FIGS. 3A and 3B), in sensor 400, enhanced uniaxial anisotropy may be provided by altered textures or a corrugated or rough surface that may face a magnetic layer of the SAF structure 306. Specifically, sensor 402 (like sensor 302 (of FIGS. 3A and 3B)) includes SAF reader stack seed 334 with a corrugated or rough surface that faces first pinned layer 316a to enhance uniaxial anisotropy. As noted earlier, the altered textures or the corrugated or rough surface of the SAF reader stack seed 334 may be generated by oblique incidence depositions. Also, for reasons provided earlier, the top surface of the pinned layer 316a is smoothed by a suitable smoothing technique.

Figure 5A:
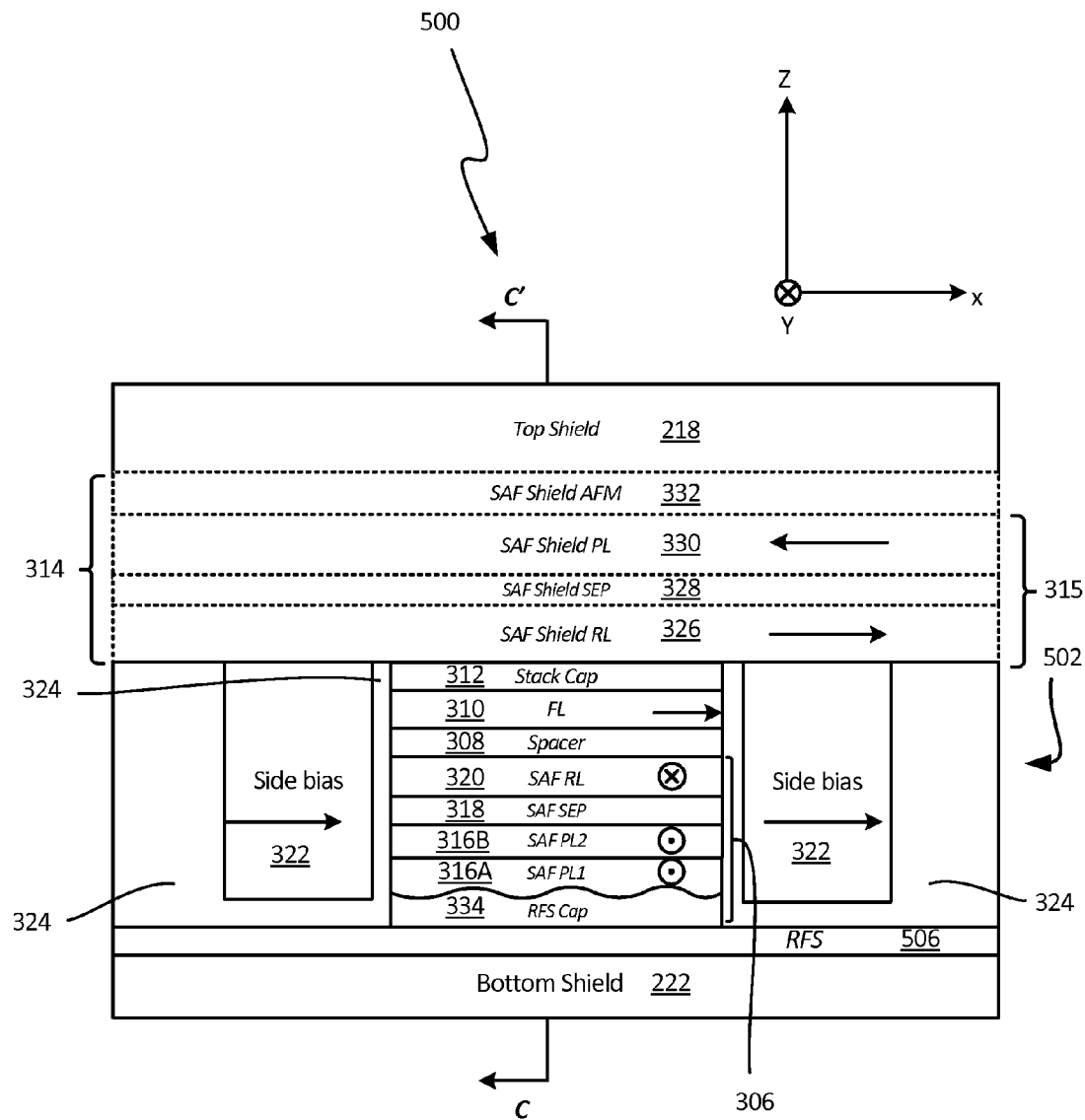
FIG. 5A is a bearing surface view of a third embodiment of a magnetic reproducing device.
Figure 5B:
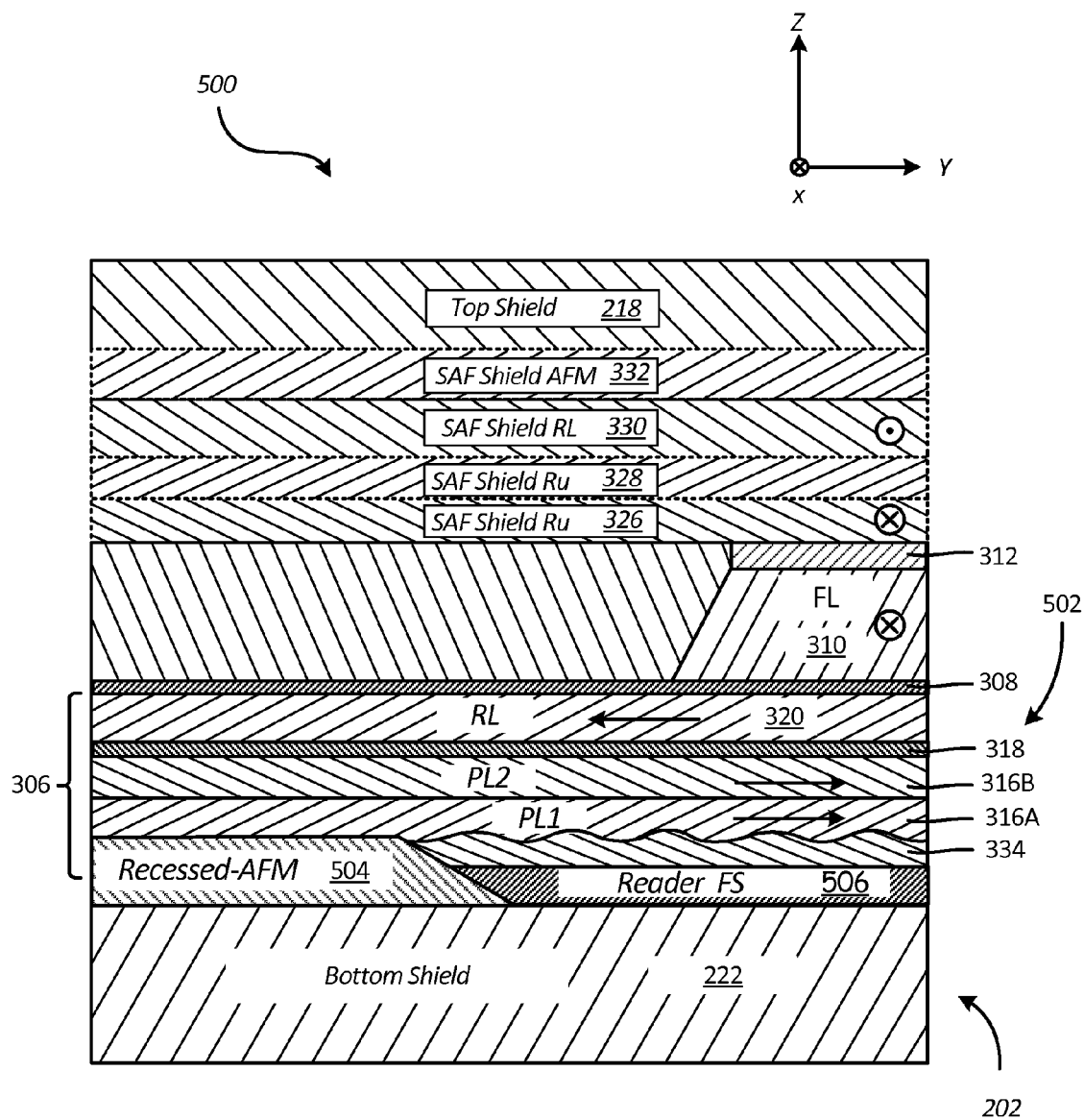
FIG. 5B is a sectional view of the magnetic reproducing device of FIG. 5A.

FIG. 5A is a bearing surface view of another reader (denoted by reference numeral 500) which includes a magnetoresistive sensor 502 that employs a recessed AFM layer to pin a ferromagnetic layer of an SAF structure such as 306. The recessed AFM layer 504 is shown in FIG. 5B, which is a cross-sectional view of reader 500 of FIG. 5A through a plane orthogonal to the bearing surface and layers of reader 500 (along line C-C' shown in FIG. 5A). In sensor 502, recessed AFM layer 504 is positioned on an opposite side of SAF structure 306 than recessed AFM layer 404 (of FIG. 4B). Thus, in sensor 502, recessed AFM layer 504 contacts a portion of an outer surface of pinned layer 316a. A remaining portion of the outer surface of pinned layer 316a is in contact with layer 334.

In the embodiment of FIGS. 5A and 5B, reader 500 is formed by first depositing recessed AFM layer 504 above an upper surface of bottom shield 222 and then forming a reader front shield (RFS) 506 above a portion of the upper surface of the bottom shield 222 that is not covered by the recessed AFM layer 504. In sensor 502, layer 334 is formed above the front shield 506 and therefore serves as a cap layer for the front shield 506. The remaining elements of reader 500 are similar to the elements of reader 300 (of FIGS. 3A and 3B) and therefore a description of the similar elements is not repeated.

In sensor 502, the magnetization of layer 316a is pinned by recessed AFM layer 504. As in the case of sensor 302 (of FIGS. 3A and 3B) and sensor 402 (of FIGS. 4A and 4B), in sensor 502, enhanced uniaxial anisotropy may be provided by altered textures and/or by a corrugated or rough surface that may face a magnetic layer of the SAF structure 306. Specifically, sensor 502 (like sensor 302 (of FIGS. 3A and 3B) and sensor 402 (of FIGS. 4A and 4B)) includes RFS cap 334, which is similar to SAF reader stack seed 334 of sensors 302 and 402, with the corrugated or rough surface that faces first pinned layer 316a to enhance uniaxial anisotropy.

Figure 6A:
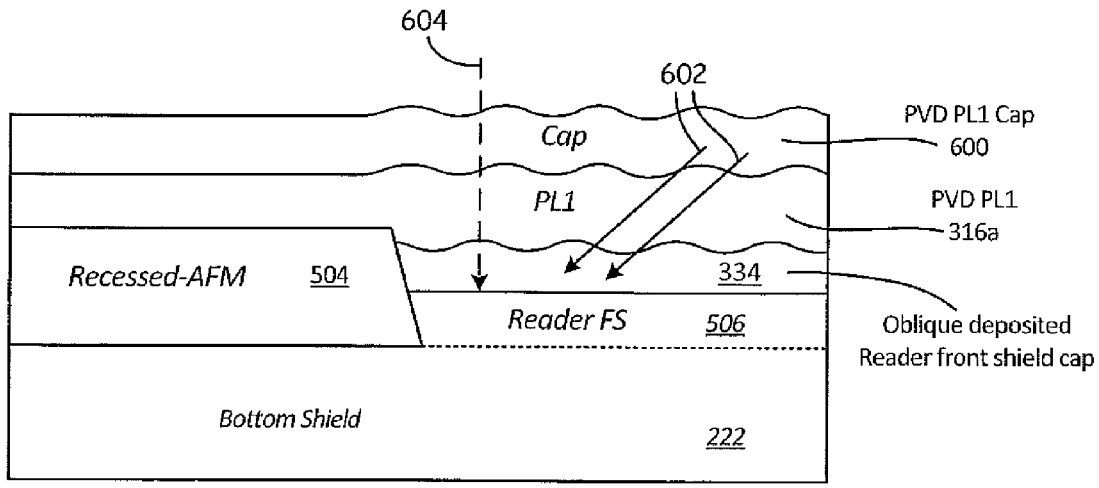
FIG. 6A-6C are schematic diagrams of reader layers that collectively illustrate formation of a portion of the magnetic reproducing device of FIGS. 5A and 5B.
Figure 6B:
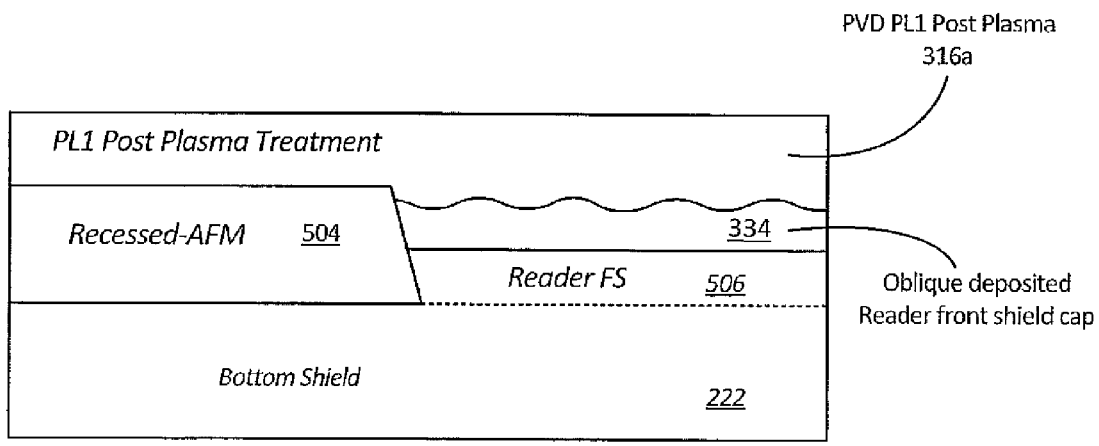
Figure 6C:
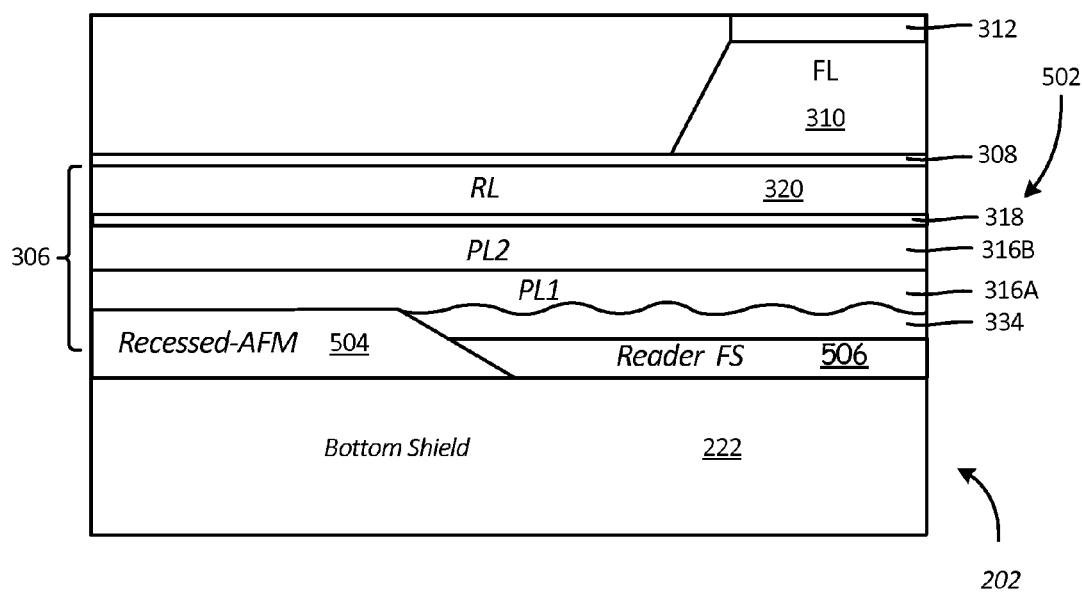

FIG. 6A-6C are schematic diagrams of side views of portions of reader 500 during different intermediate stages of formation of reader 500. Enhanced uniaxial anisotropy may be provided in reader 500 by first depositing the RFS cap 334 using oblique incidence deposition and then depositing first pinned layer 316a using any suitable physical vapor deposition (PVD) technique. In FIG. 6A, oblique deposition is represented by arrows 602, which are, for example, oblique relative to vertical dashed arrow 604 that represents a normal deposition direction. As can be seen in FIG. 6A, unevenness or roughness introduced by oblique deposition of RFS cap 334 has propagated to an upper surface of first pinned layer 316a. Since, as noted above, such propagation of roughness is undesirable, a suitable smooth treatment is applied to the first pinned layer 316a. To carry out the suitable smooth treatment, as shown FIG. 6A, a cap layer 600 is deposited over the first pinned layer 316a. This is followed by a plasma treatment process to completely remove cap layer 600 and also partially remove the pinned layer 316a to smooth its top surface. This provides for an intermediate structure that includes a PVD deposited and post-plasma treated first pinned layer 316a that has a smooth top surface as shown in FIG. 6B. Thus, by using such a procedure, the bottom uneven or rough interface between the RFS cap 334 and the first pinned layer 316a is maintained to provide the high uniaxial anisotropy without negative consequence associated with propagation of the roughness above the first pinned layer 316a. The remainder of the layers of the sensor 502 of reader 500 are then deposited to provide the structure shown in FIG. 6C. A similar combined technique of oblique incidence deposition of layer 334 and upper-layer smoothing of first pinned layer 316a can be employed to form readers 300 (of FIGS. 3A and 3B) and reader 400 (of FIGS. 4A and 4B). Details regarding fabrication techniques that may be utilized to form various magnetoresistive sensors described herein are provided below in connection with FIG. 7.

Figure 7:
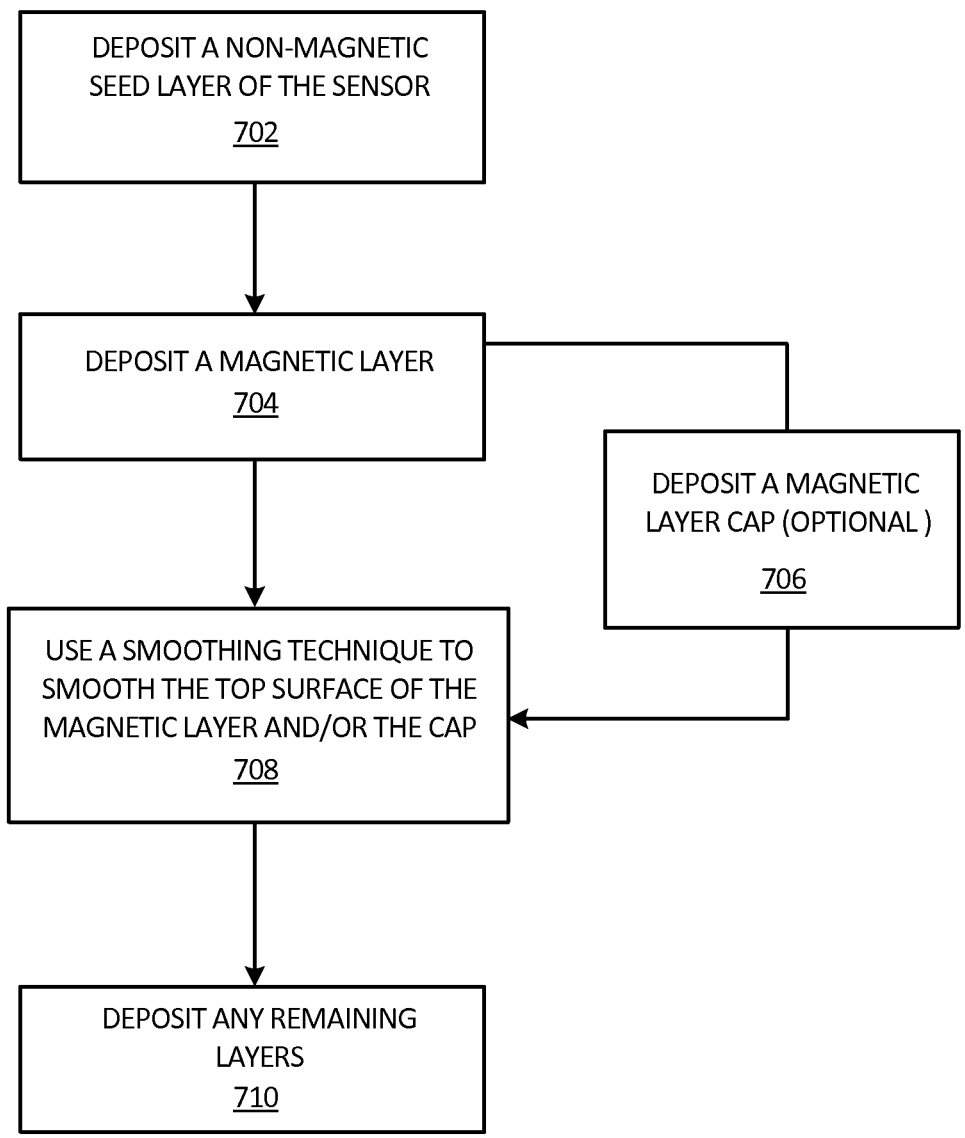
FIG. 7 illustrates example operations associated with fabrication of various magnetoresistive sensor embodiments described herein.

FIG. 7 illustrates example operations 700 associated with fabrication of the various magnetoresistive sensors described herein (including the aforementioned combined techniques of oblique incidence deposition and upper-layer smoothing). At operation 702, in generating a magnetoresistive sensor, a fabrication device deposits a non-magnetic seed layer (such as by an oblique incidence deposition technique). The seed layer can be deposited by PVD that uses an oblique angle. The unevenness or roughness created from the oblique incidence deposition technique can facilitate magnetic anisotropy in or out of a plane substantially normal to a plane of a bearing surface.

Also, the unevenness or roughness and other structural aspects of the thin film may be controlled to some extent. In an example, the oblique incidence deposition technique can be a part of a thermal evaporation method and can be controlled to have various flux incident angles. With the increasing of the incident angle there may be an increase in unevenness or roughness, which may increase the magnetic anisotropy in or out of a plane substantially normal to a plane of a bearing surface. Also, the deposition may be varied to achieve different refractive indexes, packing densities, and even birefringence of the deposited thin film. The deposition may also produce a thin film with various specific microstructures, such as wave-like structures (e.g., see the non-magnetic underlayer 334 of FIG. 3A), columns, helical structures, and zigzag shapes.

At operation 704, a fabrication device deposits a magnetic layer on the non-magnetic layer (such as by any suitable deposition technique). For example, a fabrication device may use a PVD method with or without using an oblique incidence angle. The PVD method may include depositing transition metal compounds and oxides (such as nickel oxide (NiO), hematite, chromium, and/or iron manganese (FeMn)) onto the corrugated or rough surface of the non-magnetic deposited layer. This allows the first magnetic layer (such as the first pinned layers 316a) to have a specifically shaped interface with the non-magnetic underlayer.

Optionally, at operation 706, a fabrication device deposits a magnetic layer cap on the magnetic layer (such as by any deposition technique). The deposition of the cap may include PVD with or without using an oblique incidence angle. The cap may be a non-magnetic layer (such as non-magnetic layer sharing similar materials to the non-magnetic underlayer 334). For example, the cap may be a deposition of PVD.

At operation 708, a fabrication device uses a smoothing technique to smooth the top surface of the magnetic layer and/or the magnetic layer cap. For example, a plasma treatment may be used to remove the cap and partially remove the magnetic layer so that the magnetic layer has a smooth top surface. Given this, at least operations 702 through 708 provide for a corrugated or rough non-magnetic underlayer and/or a corrugated or rough bottom surface interface to the underlayer. Also, this prevents the resulting unevenness or roughness to propagate beyond the underlayer and/or the interface.

At 710, a fabrication device deposits any remaining layers of the sensor. These remaining layers may include additional layers of the SAF structure, the free layer, and the spacer layer in between the SAF structure and the free layer.

In an example, more than one magnetic layer (including antiferromagnetic and ferromagnetic layers) may be deposited and such different types of magnetic layers may be coupled through an exchange bias. In an example, such a mechanism may include a ferromagnetic film either grown upon the antiferromagnet or annealed in an aligning magnetic field. These techniques can cause surface atoms of the ferromagnetic film to align with surface atoms of the antiferromagnet. Thus, "pin" the orientation of the ferromagnetic film.

The PVD methods described herein may include electron beam PVD (EBPVD) and the use of ion-beam assistance may be used were advantageous.

In some examples, when depositing a reference layer of an SAF structure, boron (B) may be included so that the reference layer (such as 320 of FIGS. 3A-5B) remains amorphous. An amorphous reference layer underneath a barrier (such as spacer layer 308 of FIGS. 3A-5B) influences crystallization along the (001) crystallographic orientation during an annealing process. This is especially the case when a magnesium oxide (MgO) barrier is used as an interface between the free layer and the SAF structure. The barrier's (001) orientation enhances coherent spin-dependent tunneling to create a high TMR effect.

The combined techniques of oblique incidence deposition and upper-layer smoothing can also be applied to sensor designs with only a pinned layer or only a reference layer in place of an SAF structure (i.e., instead of employing an SAF including, for example, layers 316a, 316b, 318 and 320, only one magnetic layer and an underlayer 334 is used). Additionally, such techniques may be applied to sensor designs with layers 316a and 316b exchange coupled with or without a separation layer, which may comprise a metal such as ruthenium Ru. It should be noted that the effect of the corrugated surface obtained by oblique deposition can promote a magnetic anisotropy along a direction of the corrugations. The corrugated surface may arise from "shadowing" of the deposited flux by the growing film surface.

It should be noted that $H_K$ of a magnetic layer such as 316a, 316b or 320 of, for example, an SAF structure such as 306 may be enhanced independently of employing a rough-surfaced layer such as 334 by using, for example, oblique deposition at a suitable angle to deposit the magnetic layer (s) 316a, 316b, 320. Oblique deposition of the one or more magnetic layers such as 316a, 316b or 320 at the suitable angle may cause the film structure or texture to grow in a more directional or refined columnar microstructure. For textured films, the magnetic anisotropy is typically increased along the direction of the major axis of the grains. Of course, oblique deposition may be used to form both layer 334 and one or more of layers 316a, 316b or 320, thereby creating the corrugated upper surface of layer 334 (which imparts a corrugation to the bottom surface of the magnetic layer) and providing the textured magnetic film. Additionally or alternatively, a material with intrinsically high $H_K$ may be used to form one or more of layers 316a, 316b or 320. In other words, in order to enhance uniaxial anisotropy in a sensor, a high $H_K$ material layer deposited with or without oblique incidence deposition—at or not at an underlayer—may be used. The application of a material layer having an intrinsically high $H_K$ can also enhance SAF stability.

The above-described embodiments employ either recessed AFM layers (embodiments shown in FIGS. 4A-5B) or self-pinning (i.e., no AFM layer as shown in FIGS. 3A and 3B). This results in a thickness of the read sensor at the bearing surface being less than a corresponding thickness of a read sensor that includes an AFM layer at the bearing surface. Reduction in the thickness of the read sensor at the bearing surface is advantageous as the industry progresses towards reduced form factor data storage devices and demand for larger data capacity and faster data transfer rates increases. Such demanded improvements may be associated with smaller magnetic reader sensor components. Recessed AFM layers also have potential to reduce shield to shield spacing, pulse width 50 (which is a width of a read pulse at 50% of its peak amplitude), and noise effects associated with an AFM layer. Pulse width 50 serves as a measure of the potential maximum linear density. A transition that is wider leads to a larger pulse width 50. Thus, a lower pulse width 50 is favorable for higher linear density.

Figure 8:
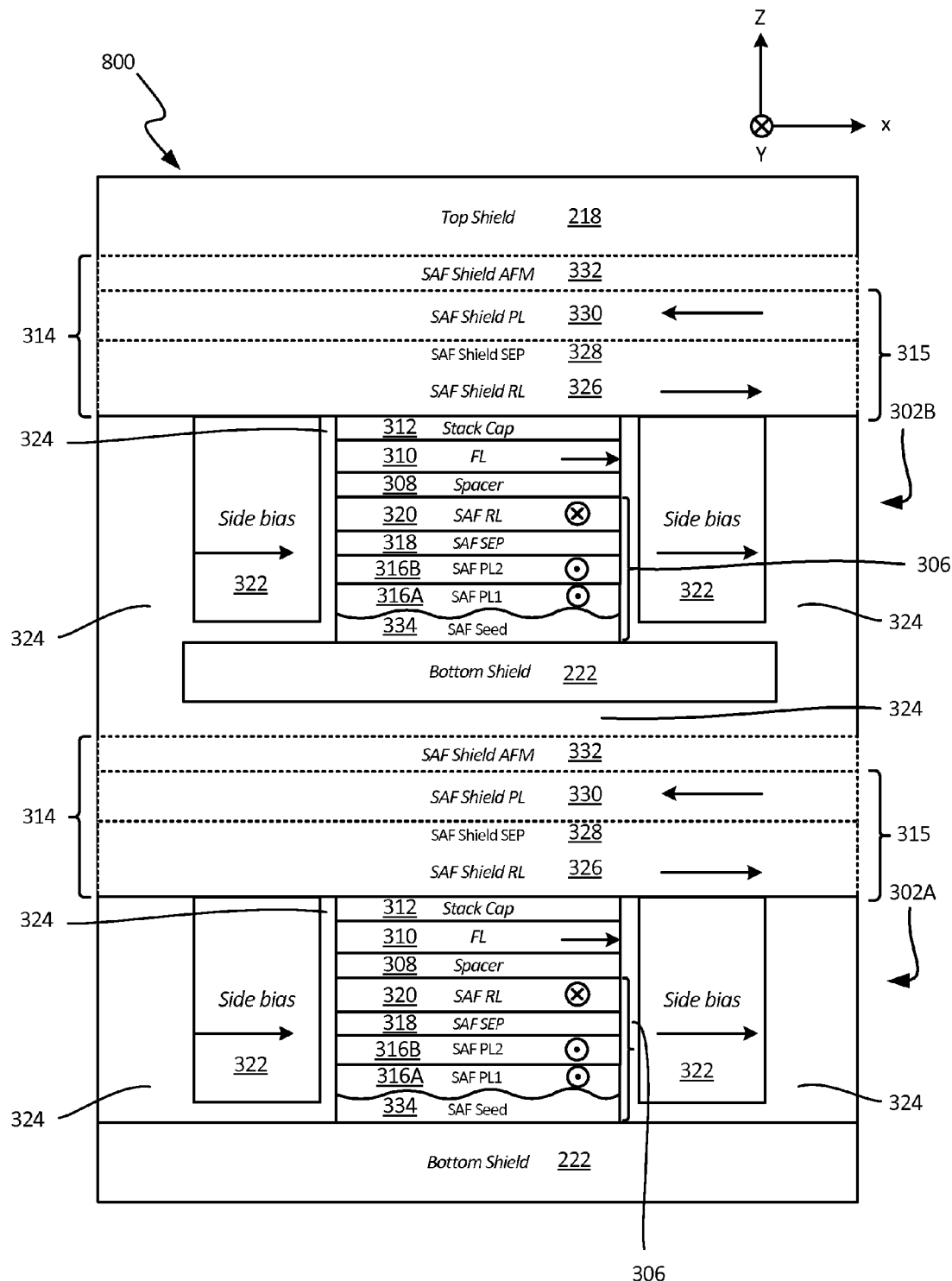
FIG. 8 is a schematic diagram of a cross-section of one embodiment of a read head including multiple read sensors.

Due to the reduced thickness at the bearing surface, the above-described reader designs are suitable for implementation in a multi-sensor configuration where two or more readers are stacked on top of each other within a single recording head. An example of a dual-reader configuration is shown in FIG. 8. The embodiment of reader 800 in FIG. 8 includes top shield 218, bottom shield 222 and sensors 302A and 302B interposed between top shield 218 and bottom shield 222. An insulation layer 324 is included between sensors 302A and 302B. Since individual layers of sensors 302A and 302B are similar to those of sensor 302, for example, described above, a description of the individual layers is not repeated in connection with FIG. 8. It should be noted that FIG. 8 is an illustrative embodiment of a multi-sensor reader and, in other embodiments, more than two sensors may be employed.

As noted above, different embodiments employ either self-pinning or recessed AFM layers. In recessed AFM designs, for example, the front part of the SAF toward the bearing surface may not be as strongly pinned as in the non-recessed AFM designs. Different read sensor designs described above improve magnetic stability of read sensors with recessed AFM layers, for example, by enhancing uniaxial anisotropy of at least one magnetic layer of an SAF structure. As described above, similar uniaxial anisotropy enhancement may also be provided to at least one magnetic layer that is not a part of an SAF structure. The at least one magnetic layer may include and/or provide structurally enhanced uniaxial anisotropy along a direction of a shape anisotropy, such as the shape anisotropy of the read sensor.

Although various examples of a magnetoresistive sensor are disclosed in the application, embodiments are not limited to the particular applications or uses disclosed in the application. It is to be understood that even though numerous characteristics and advantages of various embodiments of the disclosure have been set forth in the foregoing description, together with details of the structure and function of various embodiments of the disclosure, this disclosure is illustrative only, and changes may be made in detail, especially in matters of structure and arrangement of parts within the principles of the present disclosure to the full extent indicated by the broad general meaning of the terms in which the appended claims are expressed. For example, the particular elements may vary depending on the particular application for the enhanced uniaxial anisotropy while maintaining substantially the same functionality without departing from the scope and spirit of the present disclosure. In addition, although the embodiments described herein are directed to a particular type of read sensor utilized in a particular data storage system, it will be appreciated by those skilled in the art that the teachings of the present disclosure can be applied to other data storage devices without departing from the scope and spirit of the present disclosure.

What is claimed is:

1. A read sensor comprising:
   a free layer having a magnetization that changes according to an external magnetic field;
   a magnetic bilayer comprising a first pinned layer and a second pinned layer, wherein the first pinned layer comprises a bottom surface and a top surface, and wherein the second pinned layer is in contact with the top surface of the first pinned layer, and wherein the magnetic bilayer is stabilized by an antiferromagnetic (AFM) layer that is in contact with the bottom surface of the first pinned layer;
- a non-magnetic layer that includes a corrugated surface facing the bottom surface of the first pinned layer, the corrugated surface configured to enhance uniaxial anisotropy in the read sensor; and
- a bearing surface, wherein the AFM layer is recessed behind the bearing surface, and wherein the non-magnetic layer that includes the corrugated surface is positioned between the bearing surface and the AFM layer, and wherein the non-magnetic layer is coplanar with an upper portion of the AFM layer.

2. The read sensor of claim 1, wherein the magnetic bilayer is part of a synthetic antiferromagnetic (SAF) structure.

3. The read sensor of claim 2, wherein the SAF structure is stabilized by the AFM layer.

4. The read sensor of claim 1, wherein the corrugated surface is in contact with the bottom surface of the first pinned layer.

5. The read sensor of claim 4, wherein the top surface of the first pinned layer is a substantially smooth surface.

6. The read sensor of claim 1, wherein the non-magnetic layer includes altered textures and the altered textures are configured to enhance uniaxial anisotropy in the read sensor.

7. A read sensor comprising:
- a bearing surface;
- a bottom shield having a bottom surface, a top surface, a front surface and a back surface, wherein the front surface of the bottom shield forms a portion of the bearing surface;
- a reader front shield having a bottom surface, a top surface, a front surface and a back surface, wherein the bottom surface of the reader front shield is in contact with the top surface of the bottom shield, and wherein the front surface of the reader front shield forms a portion of the bearing surface;
- a non-magnetic layer having a bottom surface, a top surface, a front surface and a back surface, wherein the bottom surface of the non-magnetic layer is in contact with the top surface of the reader front shield, and wherein the top surface of the non-magnetic layer is a corrugated surface, and wherein the front surface of the non-magnetic layer forms a portion of the bearing surface;
- a recessed antiferromagnetic (AFM) layer positioned directly behind the reader front shield and the non-magnetic layer relative to the bearing surface, wherein the recessed AFM layer comprises a bottom surface, a top surface, a front surface and a back surface, and wherein the bottom surface of the recessed AFM layer is in contact with the top surface of the bottom shield, and wherein the front surface of the recessed AFM layer is in contact with both the back surface of the reader front shield and the back surface of the non-magnetic layer;
- a free layer having a magnetization that changes according to an external magnetic field, wherein the free layer is positioned above both the recessed AFM layer and the non-magnetic layer; and
- an additional magnetic layer in contact with the corrugated surface of the non-magnetic layer, wherein the additional magnetic layer is between the non-magnetic layer and the free layer.

8. The read sensor of claim 7 and wherein the additional magnetic layer comprises a magnetic bilayer comprising a first pinned layer and a second pinned layer, and wherein the first pinned layer comprises a bottom surface and a top surface, and wherein the second pinned layer is in contact with the top surface of the first pinned layer, and wherein the bottom surface of the first pinned layer is in contact with the corrugated surface.

9. The read sensor of claim 8 and wherein the top surface of the first pinned layer is a substantially smooth surface.

10. The read sensor of claim 7 and wherein a thickness of the recessed AFM layer is commensurate with a sum of a thickness of the reader front shield and a thickness of the non-magnetic layer.

11. The read sensor of claim 10 and wherein the top surface of the recessed AFM layer and the top surface of the non-magnetic layer are substantially in a same plane.

* * * * *